(12) United States Patent
Schuttert

(10) Patent No.: US 8,169,225 B2
(45) Date of Patent: May 1, 2012

(54) SYSTEM AND METHOD FOR ON-CHIP JITTER INJECTION

(75) Inventor: Rodger Frank Schuttert, Eindhoven (NL)

(73) Assignee: NXP B.V., Eindhoven (NL)

( * ) Notice: Subject to any disclaimer, the term of this patent is extended or adjusted under 35 U.S.C. 154(b) by 674 days.

(21) Appl. No.: 11/719,398

(22) PCT Filed: Nov. 14, 2005

(86) PCT No.: PCT/IB2005/053748
§ 371 (c)(1),
(2), (4) Date: Apr. 27, 2009

(87) PCT Pub. No.: WO2006/051508
PCT Pub. Date: May 18, 2006

(65) Prior Publication Data
US 2010/0026314 A1    Feb. 4, 2010

Related U.S. Application Data

(60) Provisional application No. 60/628,070, filed on Nov. 15, 2004.

(51) Int. Cl.
*H01H 31/02*  (2006.01)
(52) U.S. Cl. ....... 324/555; 327/156; 327/158; 327/291; 375/226; 375/371
(58) Field of Classification Search ............. 324/555
See application file for complete search history.

(56) References Cited

U.S. PATENT DOCUMENTS

| | | | | |
|---|---|---|---|---|
| 4,884,286 A * | 11/1989 | Szdzepanek et al. | | 375/372 |
| 5,793,822 A * | 8/1998 | Anderson et al. | | 375/371 |
| 6,337,590 B1 * | 1/2002 | Millar | | 327/158 |
| 6,392,456 B1 * | 5/2002 | Pyeon et al. | | 327/156 |
| 6,815,990 B2 * | 11/2004 | Lee | | 327/158 |
| 7,120,215 B2 | 10/2006 | Li et al. | | |
| 7,165,196 B1 * | 1/2007 | Porat et al. | | 714/716 |
| 7,203,460 B2 * | 4/2007 | Boose et al. | | 455/67.11 |
| 2002/0176491 A1 * | 11/2002 | Kleck et al. | | 375/226 |
| 2003/0156545 A1 * | 8/2003 | Shimanouchi et al. | | 370/241 |
| 2003/0202573 A1 * | 10/2003 | Yamaguchi et al. | | 375/226 |
| 2004/0008762 A1 * | 1/2004 | Garlett et al. | | 375/224 |
| 2004/0046596 A1 * | 3/2004 | Kaeriyama et al. | | 327/165 |
| 2005/0116759 A1 * | 6/2005 | Jenkins et al. | | 327/291 |
| 2006/0061399 A1 * | 3/2006 | Xu et al. | | 327/287 |
| 2010/0090709 A1 * | 4/2010 | Watanabe et al. | | 324/555 |

FOREIGN PATENT DOCUMENTS

| | | |
|---|---|---|
| CN | 1400662 A | 3/2003 |
| CN | 1519934 A | 8/2004 |
| EP | 1 464 970 A1 | 10/2004 |

* cited by examiner

*Primary Examiner* — Melissa Koval
*Assistant Examiner* — Benjamin M Baldridge

(57) ABSTRACT

High Speed I/O interfaces such as DVI, S-ATA or PCI-Express require expensive test equipment. Loop-back tests are widely used as one alternative, but lack coverage of timing-related defects. A system and method for on-chip jitter injection using a variable delay with controllable amplitude and high accuracy is provided that improves the coverage of loop-back tests.

19 Claims, 8 Drawing Sheets

SYSTEM AND METHOD FOR ON-CHIP JITTER INJECTION

The present invention relates to an on-chip jitter injection that provides well-defined and controllable jitter that enables measurement of deterministic jitter as well as random jitter.

High-speed serial I/Os (HSIO) such as IEEE 1394, USB2.0, DVI, S-ATA and PCI-Express are widely-used interconnection methods. The usage can be expected to increase rapidly since conventional interconnections do not allow high data rates. Currently-used Automated Testing Equipment (ATE) has very limited capabilities to test differential, low-voltage swing and high-speed interconnections. Expensive ATE extension cards are available but apart from the increased tester costs they also substantially increase the effort for loadboard development. The impending pervasiveness of high-speed interfaces such as Serial ATA (SATA) and PCI Express increases the need for a low-cost, high-integrity test solution for high-volume device manufacturing.

In an alternative test method, the transmitter (Tx) to receiver (Rx) loop-back method is widely used, also referred to as HSIO BIST. The Tx is put in a test mode where it transmits the test data and the Rx receives the same data, which is compared with the transmitted data for error detection.

A known problem of loop-back tests is the tolerance of the Clock-Data Recovery (CDR) part of the Rx. The CDR is capable of retrieving correct data in the presence of a specified amount of jitter and attenuation, which in application is needed to deal with signal degradation in the interconnect. Jitter is the time difference between when a pre-defined event should have occurred and when it actually did occur. The time difference is expressed in unit interval (UI), 1 UI is the value of the bit period of the ideal clock signal. This time difference can be treated as phase modulation; there are one (or more) signals modulating the ideal position of the data signal. The Tx, however, sends a clean signal, so in a loop-back mode the CDR will not be tested for its jitter tolerance. Also jitter generation in the Tx is not tested with a normal loop-back. Without jitter insertion, the system will operate comfortably in the "safe" region, and only relatively large abnormalities will cause a faulty device to be detected. Jitter is important because of its potential for causing bit errors in received data. Jitter consists of two components termed Deterministic Jitter (DJ) and Random Jitter (RJ). Deterministic Jitter is caused by bandwidth limitations and component interactions, for example. Random Jitter is caused by thermal and noise effect and is statistical in nature. It is unbounded and typically a Gaussian probability density distribution is used to characterize RJ. Typically a bit-error rate (BER) is required in the order of $10^{-12}$, necessitating a range of $14.1\sigma$ to capture sufficient events for the total jitter budget.

A further problem related to high-speed I/O is the long measurement time needed to verify the bit-error rate (BER). For a number of protocols the specified BER is $10^{-12}$, a value derived from a probability of random jitter with a value of $7\sigma$ out of the nominal ideal sample moment (where $c\sigma$ is the standard deviation). To have a reasonable probability of such a random event occurring requires sending and receiving a large amount of data (several times $10^{-12}$), resulting in a test time of hours or days.

To decrease BER test time, a bathtub-curve test can be used. Referring now to FIG. 1, the bathtub curve gives the jitter to a BER relationship. In the presence of a certain amount of jitter a corresponding BER can be expected for a properly-functioning device. Measuring several points on the curve and extrapolating the result gives an estimate for the eye-opening at a BER of $10^{-12}$.

Off-chip jitter injection is typically done on a loadboard or in an Automated Test Equipment (ATE). These external solutions require high-speed signals to be routed on the loadboard and add costs since they require specialized ATE cards. The external method is required to have Loop-back DfT, including signal generation and error checking present on-chip. Furthermore, separating the transmitter Tx and receiver Rx at the IC pins is not valid for USB 2.0 and other bi-directional interfaces.

The system and method of the present invention provide a way for embedding jitter injection that is well defined and controllable.

By contrast, known solutions for embedded jitter insertion do not offer the possibility of adding well-defined and controllable jitter. Controllable jitter allows measurement of multiple points on the bathtub curve, resulting in better fault coverage. The accuracy is needed to reduce the risk of falsely rejecting properly-functioning devices and increase the ability to detect faulty devices.

Products that pass production tests must be guaranteed to meet certain pre-set specifications. This doesn't mean there is a need to test all these specifications, assuming a production device is guaranteed to be according to specifications if the manufacturing process is within its limits. However, the manufacturing process itself adds hard defects, soft defects and parametric abnormalities, where hard and soft defects are local abnormalities originating, for example, from spot defects or local doping variations. If it is assumed that the process itself is monitored and within specifications, all that is needed is to detect soft and hard defects with a manufacturing test.

A large part of the hard defects and also a part of the soft defects can be detected with a straight loop-back test. Detection of the remaining defects is an object of the jitter insertion system and method of the present invention.

Hard and soft defects potentially decrease the jitter budget of a system due to the increased effect of three causes: random jitter, deterministic jitter and offsets. These cause each have a different effect on the bathtub curve 100, see FIGS. 1A-B.

Increased Random Jitter (RJ): The steep part 101 (in the low BER region of the bathtub curve) is dominated by random jitter and should follow a Gaussian distribution function; a smaller spread (a) of the random jitter gives a steeper curve. Therefore, a small slope in the part of the curve where it is supposed to be steep indicates a high level of random jitter.

Increased Deterministic Jitter (DJ): If DJ is present it widens the top edge 120 of the bathtub curve up to a certain amount of UI, "shifting" the curve towards the center, see FIG. 1B.

Offsets: Apart from timing offsets, such as duty-cycle distortion, static, voltage offsets also affect the moment of sampling and translate into a static timing offset. On the bathtub curve this is a shift towards the center of the curve, making the opening smaller at a given BER, similar to increased levels of DJ. Some offsets are asymmetrical with respect to the sides of the bathtub.

The DJ level and RJ level are estimated from a bathtub curve where the offsets are included in the DJ level. The estimation can be done using well-known curve-fitting techniques.

Referring now to FIG. 2, the present invention measures points of the bathtub curve by injecting a controlled amount of jitter 203 and counting the BER 208 in the presence of the injected jitter. This method requires a BER counter 208 and a jitter injection circuit. In a preferred embodiment, the BER counting 208 is added to a loop-back test circuit using a bit sequence generator and BER counter 208, whose loop-back circuit is already widely used for high-speed I/O (HSIO) tests. Using the jitter-insertion approach of a preferred embodiment, it is possible to perform a quick measurement of a point on the bathtub curve, by injecting a controlled amount of jitter and counting the BER.

Three basic methods of jitter injection are known:
(1) add jitter to a phase-locked loop (PLL);
(2) add a variable delay to the data stream; and,
(3) add a fixed delay every $n^{th}$ bit.

Apart from jitter injection, there are also known solutions that allow characterization of the CDR timing margin.

A problem associated with the first jitter-insertion method, adding jitter to a PLL, is related to the clock strategy used in many of the HSIO physical layers (PHYs). The clock for the serial data is the same as the clock for the high-speed digital logic, and the low-speed digital is often derived from the HSIO clock. Furthermore, the Rx clock also is often derived from the same source PLL. In all those cases, adding jitter to the PLL also adds unwanted jitter to the rest of the circuit and potentially creates false rejects of properly-functioning devices by a production test.

The second jitter-insertion method, adding a variable delay to the data stream, does not suffer from the above problem, and therefore has wider application. The amplitude of the variation of the inserted delay corresponds to the amount of inserted jitter.

The third option, adding a fixed delay every $n^{th}$ bit relates to testing the ability to handle Tx and Rx clock frequency offset, is often specified as a (few) 100 ppm. This can be used as an additional test, but doesn't replace the jitter injection as used for a bathtub curve measurement.

In a preferred embodiment, jitter is inserted using a variable delay and the location where the jitter is applied is in the high-speed part, thus preventing the digital logic that is clocked by a derived version of the high-speed clock from creating bit-errors that are not due to defects but due to the test method. In a preferred embodiment, the node in the transmitter that connects the high-speed digital signal to the Tx driver is used to insert jitter. In alternative embodiments, any other node in the high-speed part between the transmitter and the receiver sampler also can be used to insert jitter.

In the following description, by way of explanation and not limitation, specific details are set forth such as the particular architecture, interfaces, techniques, etc., in order to provide a thorough understanding of the present invention. However, it will be apparent to those skilled in the art that the present invention may be practiced in other embodiments that depart from these specific details.

The present invention provides a system and method for inserting jitter into a test circuit such as a circuit derived from the well-defined phases generated by a multi-phase delay-locked loop (DLL) or phase-locked loop (PLL). Such a DLL or PLL is also employed for a widely-used type of clock and data recovery, the over-sampling technique, which allows re-use of this circuit. Another aspect of the present invention is the capability for control of the amplitude of the inserted jitter, which allows measuring multiple points on the bathtub curve. The system and method of the present invention allows determination of the levels of deterministic jitter separately from random jitter, which in turn allows calculation of the total jitter at other bit-error rates.

For the jitter injection of the system and method of the present invention it is assumed that loop-back test design for testability (DfT) technology 201 is present (see FIG. 2), including a (pseudo-random) bit sequence (PRBS) generator and error checker with an error counter.

Figure 1A:
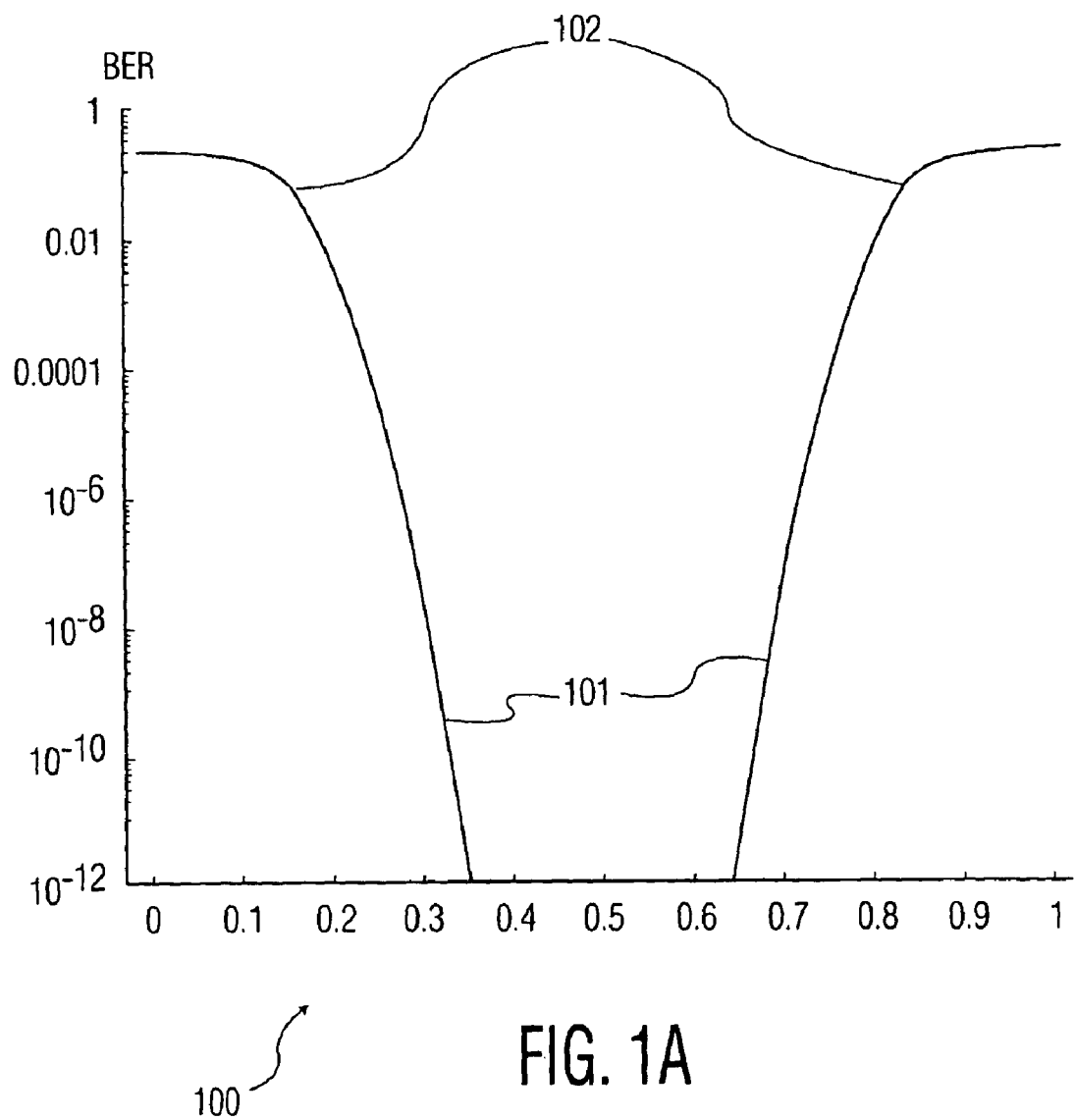
FIG. 1A illustrates a typical bathtub curve.
Figure 1B:
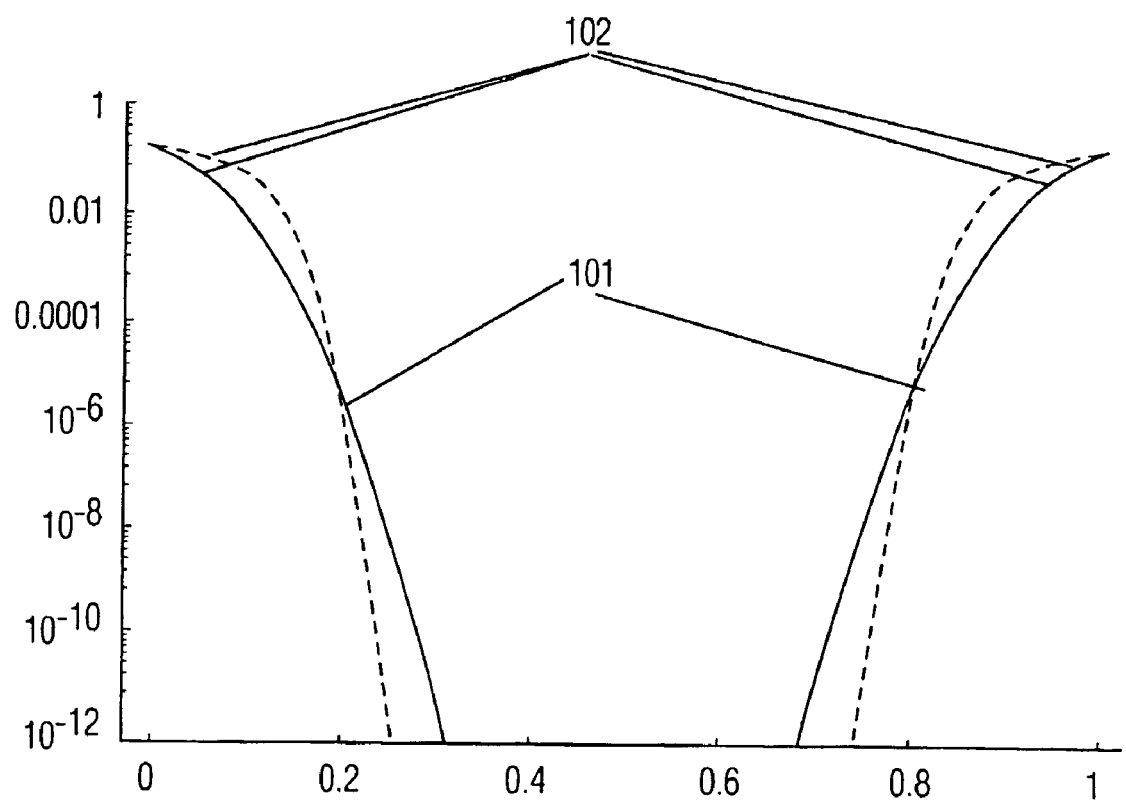
FIG. 1B illustrates how RJ and DJ affect bathtub curves, where one curve (dashed) contains more DJ and less RJ compared to another curve (solid)
Figure 2:
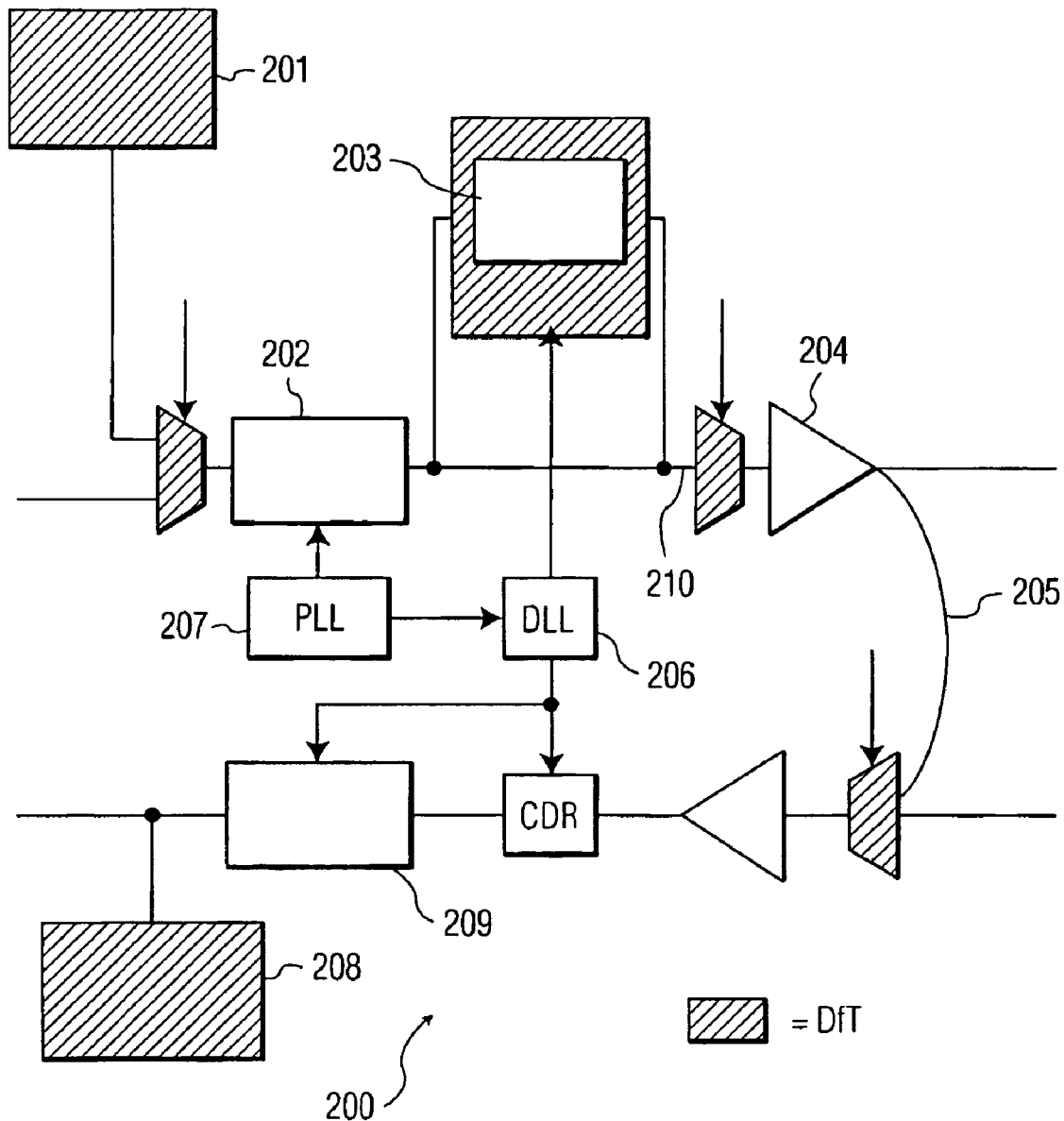
FIG. 2 illustrates a high-speed IO (HSIO) PHY with a BER test DfT and jitter injection before a Tx buffer.

For the jitter injection in a first preferred embodiment illustrated in FIG. 2, a variable delay 203 is added between a serializer output 202 and a transmit buffer input 204. In a second preferred embodiment (see FIG. 3) the jitter 203 is inserted in a loop-back signal 205, which has the advantage that no additional multiplexer is needed in the Tx path for the jitter insertion, the multiplexer already needed for straight loop-back testing is used. To verify the inserted jitter, the signal is observed at the Rx pins.

In another aspect of the present invention the loop-back selection multiplexer is extended to a three-input multiplexer to allow for selection of a straight loop-back if needed. This allows comparison of measurements with and without the variable delay 203, but is not strictly needed if the jitter amplitude is programmed to minimal amplitude, adding a fixed delay (discussed further below).

Figure 4:
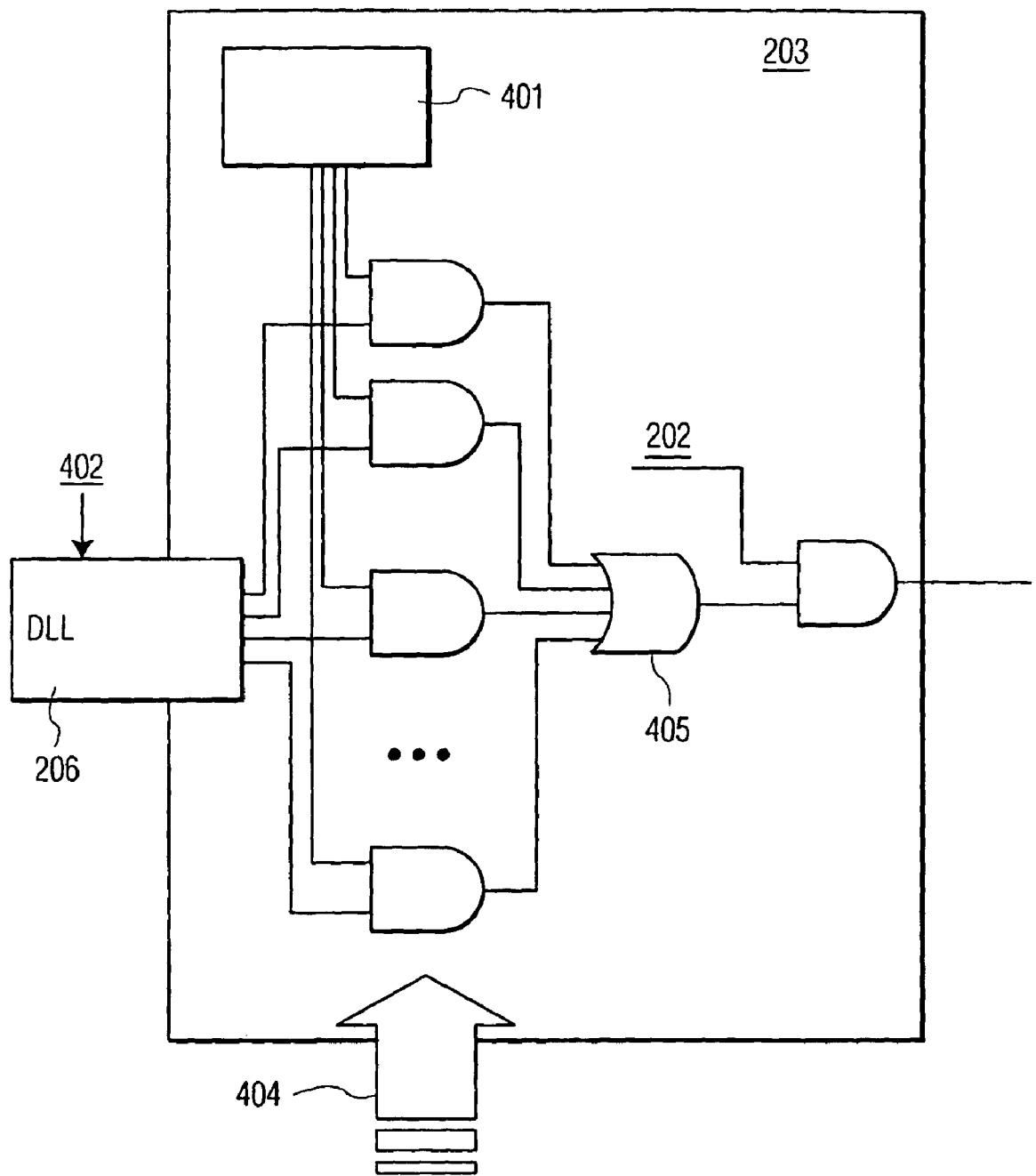
FIG. 4 illustrates an architecture of a variable delay that can be used for jitter injection; and, FIG. 5 illustrates a delay select-delay-bit generation part of a variable delay line, showing the AND used to generate a "selected delay" bit for one phase.

The variable delay 203 uses the multiple phases generated by a DLL 206 or PLL 207 (see FIG. 4). In the sections that follow, only DLL 206 for multi-phase clock generation is discussed but one skilled in the art will realize that PLL can be used readily as well.

Multi-phase clock generation types of DLL are also used for Clock-Data-Recovery circuits using over-sampling. The DLL 206 adjusts the delay to one Rx clock cycle and generates a number of phases, such as a 3 per-bit period.

One of the DLL phases is selected for the current bit period. The serializer 202 bit sequence output is blocked until the selected phase changes from '0' to '1,' using an AND port. The "Select Delay" block 401, illustrated in FIG. 5, generates for each DLL 206 phase a bit that selects the phase. The select bit is used to block or let pass the phases using an AND port 404. The resulting blocked/passed phases are combined in an OR port 405, such that if multiple phases are selected the first one that changes from '0' to '1' dominates the resulting (variable) delay; this property is used for the amplitude selection.

Figure 5:
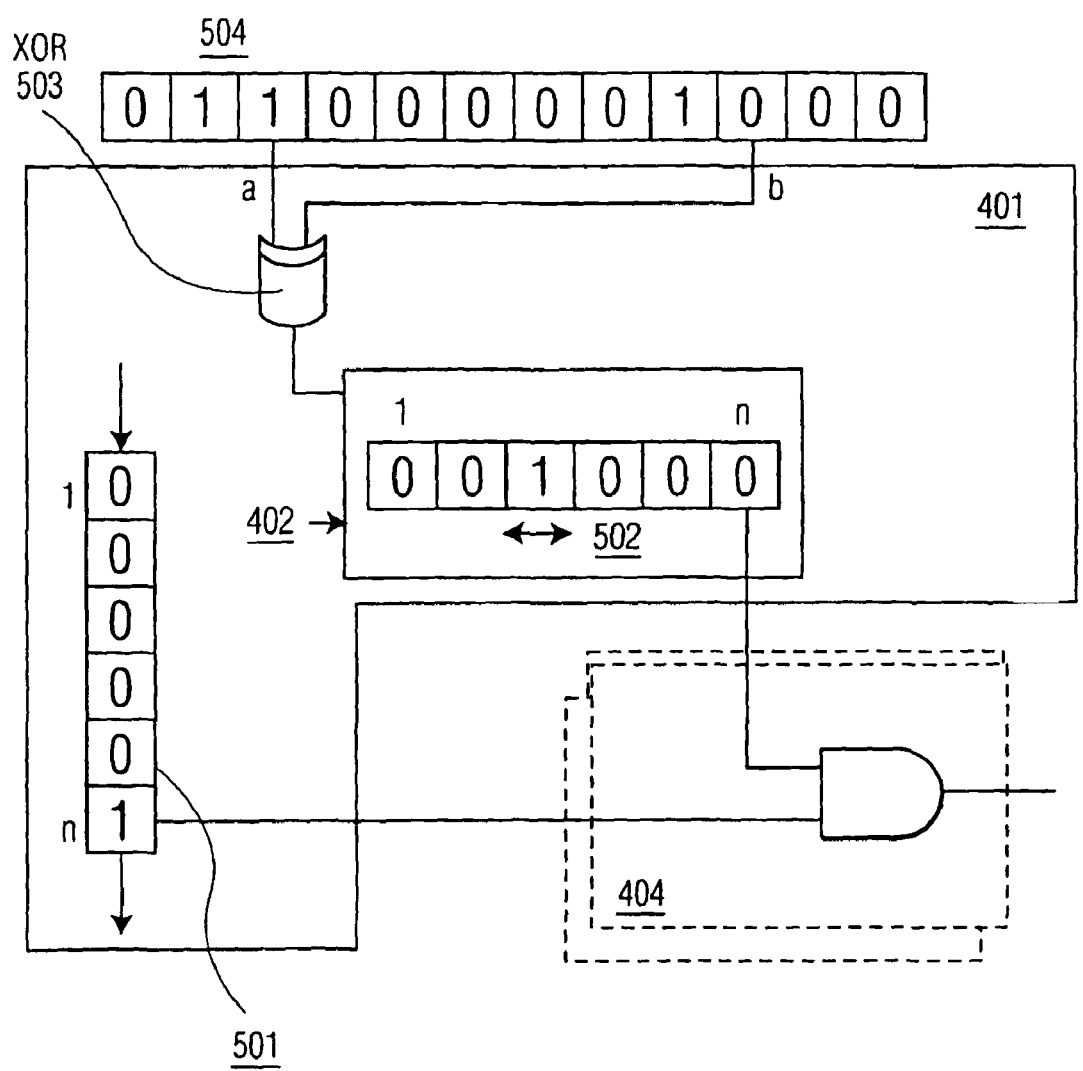

Programming the amplitude selection shift register 501, as illustrated in FIG. 5, controls the jitter amplitude. The lowest bit in this register determines the maximum delay that can be selected. If a higher delay is selected than the programmed amplitude, both selection bits will be high and both phases will be combined in the OR port 405, so the smallest delay dominates the resulting delay.

The phase selection is done in this embodiment by shifting back and forward a walking '1' in a shift register 502. The up/down selection is done pseudo-randomly by taking a function of the data bits. In a preferred embodiment as illustrated in FIG. 5, the XOR function 503 of 2 data bits is used. The usage of the serializer register 504 contents for up/down selection does create a data dependency in the jitter. The implementation in the depicted embodiment works with (pseudo) random data contents (which is widely used for high-speed I/O test patterns). In this embodiment the '1' remains in bit position 'n' when an 'up' signal is generated, avoiding large phase jumps. Similarly, a '1' in bit position '1' will remain in that position when a 'down' signal is issued. This affects the jitter-probability distribution since the probability of the highest and lowest phases being selected is higher. In another aspect of the invention the serializer register 504 is circular to provide a more uniformly-distributed jitter, however, with large phase jumps. Still, with other than maximal jitter amplitude selected there will be jitter levels with higher probability.

In an alternative embodiment an up/down counter is used to count from '1' to 'n' and back, making this alternative embodiment for jitter insertion independent of the data contents of the transmitted signal.

The purpose of the up/down shifting is to avoid always having the same jitter for a given bit sequence and to allow creation of jitter with a frequency of the high-speed clock divided by a selected amplitude.

In another aspect, the up/down shift register is omitted and the 'n' selection bits are created directly from the data. One possible disadvantage of this approach is that the jitter could be present as cycle-cycle jitter, which may stress the system too much. This depends on the system used.

In a further alternative embodiment in which two-phase inputs are used, 'n'=2), the up/down shift register is omitted, as well as the multi-phase DLL and the two phases are made using the high-speed clock and its inverse.

Using a multi-phase DLL (or PLL) has the advantage that more than one amplitude of jitter can be inserted and the amount of jitter can be controlled very precisely compared to normal delay lines, and it allows the jitter amplitude to be programmed by selecting the phases that are used for delaying the data.

The DLL (or PLL) with multi-phase output has the advantage that the maximal delay is exactly one UI, and it allows a precise subdivision into a number of phases. Such DLLs (and PLLs) are also used to generate the phases for over-sampling CDR circuits, which allows a re-use of these circuits.

The present invention provides a system and method for on-chip jitter injection that is controllable and thereby contributes to the cost and functional effectiveness of testing of HSIO devices. Compared with known jitter-injection solutions, the on-chip jitter injection into a commonly-used loop-back test configuration by using a variable delay, and has the advantage of performing a bathtub-curve type of measurement that can be used to determine the BER of the HSIO in the commonly-used loop-back test configuration.

Further, when a fixed amount of jitter is inserted into a commonly-used loop-back test configuration, the system and method of the present invention allows performing a one-point BER test. For a one-point BER test, the amount of added jitter is in the order of the specified jitter tolerance at the Rx pins (of approximately 40% to 60% UI), to be able to test for a too-high level of DJ and/or RJ. In that case, adding a jitter of 50% UI would, for most cases, bring the looped-back system into the sensitive area, resulting in an expected BER that can be measured in a reasonable time. A one-point measurement, however, cannot be used to decompose the jitter into Deterministic and Random Jitter components. This decomposition is needed to be able to extrapolate a fitted curve down to lower BERs, used to estimate the eye-opening at, for example, the specified BER. A too-high RJ level can be compensated for by a better-than-expected DJ, or vice versa. A one-point measurement will not give information about these jitter components so it potentially rejects properly-functioning devices, or does not detect improperly-functioning devices.

When a number of jitter levels are inserted, more points of the bathtub can be measured and from these results the RJ and DJ can be more accurately estimated, which results in better coverage and less risk of falsely rejecting properly-functioning devices.

For a successful bathtub-curve measurement the amount of injected jitter needs to be accurately known. Any error in, the injected jitter amplitude results in a large offset in a BER due to the logarithmic relation between the injected jitter and the resulting BER.

The amplitude, frequency, probability distribution and amplitude-step resolution of injected jitter need to be defined.

In most modern HSIO protocols the amount of jitter that results in at least a BER of $10^{-12}$ or better is specified as a keep-out area in the eye-diagram, expressed in the % of the unit interval (UI). Examples are 60% UI of jitter tolerance at the 0-crossings at Rx pins specified in PCI Express measured over 250 consecutive bits (approved as a standard on Apr. 17, 2002, PCI-Express is intended to be an evolutionary upgrade to the existing PCI bus). For Serial ATA, a serial link comprising a single cable with a minimum of four wires used to create a point-to-point connection between devices (SATA or S-ATA) this is 62% over 250 bits and 45.5% over 5 bits. For Digital Visual Interface, a digital interface standard created by the Digital Display Working Group (DDWG) to convert *analog* signals into digital signals to accommodate both analog and digital monitors (DVI), this is 50% ($10^{-9}$ pixel-error rate); for USB 2.0, this is 40% (recommended at Rx pins but specified 35% at connector pins).

A controllable amplitude up to one UI allows measurement of the relevant points on the bathtub curve. The resolution of the steps in jitter amplitude preferably allows measurement of at least two points in the part of the curve that is dominated by the RJ (low BERs). On the other hand, it is desirable to measure as-high-as-possible BERs to substantially decrease test time (the lower the BER, the more bits are required to achieve the same accuracy). A resolution (not accuracy) of approximately 10% to 20% UI allows this.

The probability distribution of the inserted jitter affects the measured BER. The probability density is determined by the jitter modulation signal. For example, a sine-wave modulation creates a different probability distribution compared to a square wave distribution. If the jitter modulation is the same for all tested devices the differences (due to jitter modulation types) in a measured BER can be accounted for by adjusting the test limits.

Figure 6A:
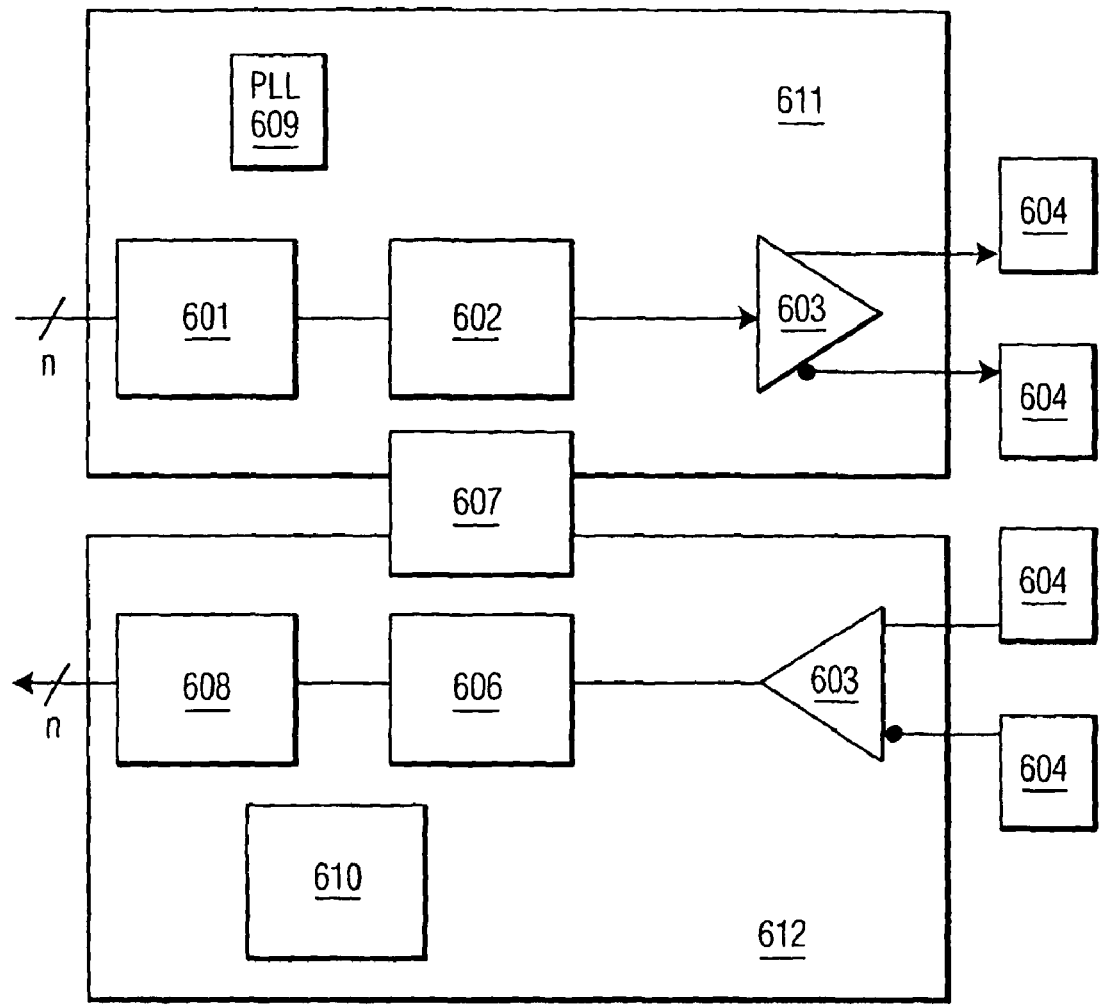
FIG. 6A illustrates a basic serial HSIO transceiver PHY.
Figure 6B:
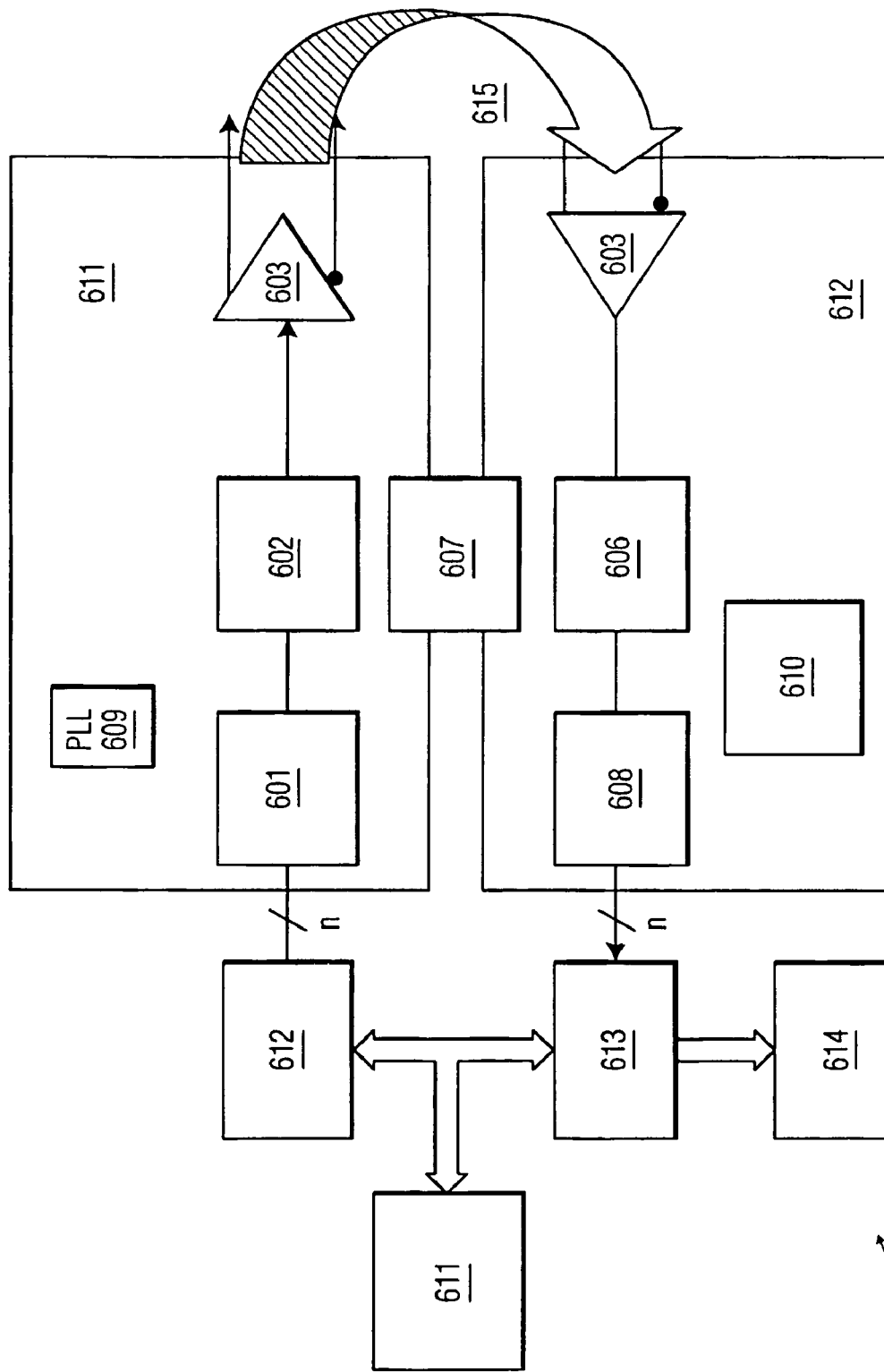
FIG. 6B illustrates the modification of the basic transceiver of FIG. 6A to perform loop-back testing.

Referring now to FIG. 6A, a basic serial HSIO transceiver PHY is illustrated that enables data rates greater than 1 Gbps. FIG. 6B illustrates modification: of the basic transceiver of FIG. 6A to perform loop-back testing:
  use TX 611 to drive RX 612 so that the loop can be closed at various levels, both on- and off-chip;
  allows simple automated testing equipment (ATE); and,
  no external high-speed DUT interface or instruments are required.

Figure 3:
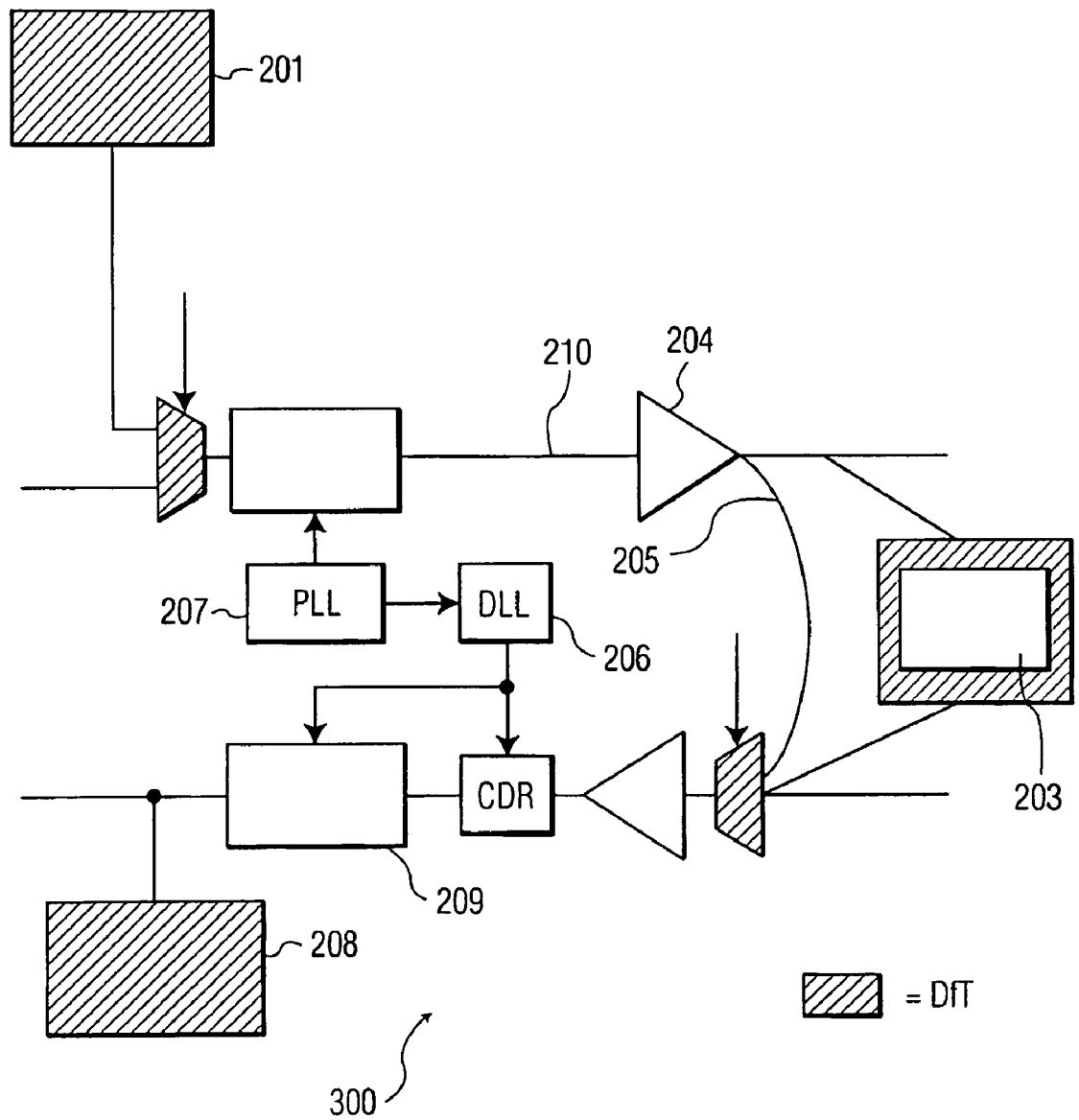
FIG. 3 illustrates a high-speed IO (HSIO) PHY with a BER and DfT and jitter inserted between Tx and Rx.

As already indicated, among other drawbacks the test configuration of FIG. 6B does not test well timing-related defects. Further, given the configuration of FIG. 6B, parametric defects may cancel out The system and method of the present invention can be used both to improve production test accuracy and to reduce production test costs for all products using high-speed I/Os including Serial-ATA, PCI-Express, USB 2.0, Firewire, and DVI. With the addition of the present invention, as illustrated in FIGS. 2 and 3, an enhanced loop-back test configuration results in having higher coverage for soft and parametric defects.

While the preferred embodiments of the present invention have been illustrated and described, it will be understood by those skilled in the art that various changes and modifications may be made, and equivalents may be substituted for elements thereof without departing from the true scope of the present invention. In addition, many modifications may be made to adapt to a particular situation, such as format changes of the request and response frames and elements thereof, and the teaching of the present invention can be adapted in ways that are equivalent without departing from its central scope. Therefore it is intended that the present invention not be limited to the particular embodiment disclosed as the best mode contemplated for carrying out the present invention, but that the present invention include all embodiments falling within the scope of the appended claims.

The invention claimed is:

1. A variable delay apparatus to generate a pre-determined delay corresponding to a desired jitter amplitude for an input sequence of data bits, comprising:
   a multi-phase clock-generation component outputting n phases, wherein n is an integer greater than 1;
   a selector comprising:
   a delay block that outputs n phase selection bits, each phase selection bit respectively selecting or blocking each of said plurality of n phases; and
   a logical AND circuit that blocks or lets pass each of the plurality of phases according to the corresponding bit of the n phase selection bits;
   a programmable amplitude selector for outputting a maximum pre-selected delay that controls jitter amplitude: and
   a logical OR circuit that combines the pre-selected delay with each blocked or passed phase of the selector and outputs the resultant delay as the generated predetermined delay.

2. The apparatus of claim 1, wherein the n phase selection bits are created directly from the input sequence of data bits.

3. The apparatus of claim 1, wherein n is two, the multi-phase clock generation component comprises a high-speed clock, and the two phases comprise the high-speed clock and the inverse of the high-speed clock.

4. The apparatus of claim 1, wherein the multi-phase clock-generation component comprises:
   a high-speed clock; and
   a device selected from the group consisting of a Delay Locked Loop (DLL) and a Phase Locked Loop (PLL), said device coupled to said high-speed clock to adjust a delay to a one-clock cycle and generate a plurality of clock phases.

5. The apparatus of claim 1, wherein the delay block further comprises a shift register of n bits wherein a bit with a logical one value is shifted in the shift register backward and forward, wherein the phase selection is determined by selecting a phase pseudo randomly, according to a function of a subset of the input sequence of data bits with a low-order shift register bit if the low order bit has a logical one value and is blocked otherwise.

6. The apparatus of claim 5, wherein the function is a logical XOR of two predetermined bits of the input sequence of data bits.

7. The apparatus of claim 5, wherein the subset of the input sequence is provided via a circular register.

8. The apparatus of claim 5, wherein the function is to count up from 1 to n and back down.

9. A method for generating a pre-determined delay for an input sequence of data bits, comprising:
   generating n clock phases, wherein n is an integer greater than 1;
   generating n phase selection bits;
   passing or blocking each of said n generated phases based on the generated n phase selection bits;
   providing a maximum pre-selected delay that controls jitter amplitude;
   combining the pre-selected delay with each of the passed or blocked phases, and
   outputting the resultant delay as the generated pre-determined delay.

10. The method of claim 9, further comprising:
    generating the n phase-selection bits directly from the input sequence of data bits.

11. The method of claim 9, wherein n=2 and further comprising:
    generating two clock phases as a high-speed clock and the inverse of the high-speed clock.

12. The method of claim 9, further comprising:
    providing a high-speed clock; and
    using a device selected from the group consisting of a Delay Locked Loop (DLL) and a Phase Locked Loop (PLL), coupled to said provided high-speed clock to perform the steps of:
    adjusting a delay to one-clock cycle; and
    generating a plurality of clock phases.

13. The method of claim 9, further comprising:
    providing a shift register of n bits wherein a "1" bit is randomly shifted in the shift register an amount backward and forward, wherein the phase selection is determined by selecting a phase according to a function of a subset of the input sequence of data bits with a low-order shift register bit if the low order bit has a logical one value and is blocked otherwise.

14. The method of claim 13, wherein the function is a logical XOR of two predetermined bits of the input sequence of data bits.

15. The method of claim 13, further comprising:
    providing the subset of the input sequence via a circular register.

16. The method of claim 13, further comprising:
    counting up from one to n and back down.

17. A system for on-chip jitter injection into a high-speed circuit, the system comprising:
    a High Speed Input Output (HSIO) test circuit comprising:
    a test-signal generator operably coupled to a serializer for generating a parallel input test signal as an input to the serializer operably coupled to a transmit buffer of a transmitter to serialize the parallel input test signal to a serial test signal and input the serial test signal to the transmit buffer,
    a loop-back circuit arranged between the transmitter and a receiver for transmitting there-between the serial test signal,
    a deserializer for providing a parallel output signal from a serial test signal received by the receiver and a BER counter to count errors in the parallel output signal; and
    a variable delay arranged between a serializer output and a transmit buffer input to inject a pre-determined amount of jitter into the serial test signal, wherein the variable delay is generated by a variable delay apparatus that generates a pre-determined delay corresponding to a desired jitter amplitude for an input sequence of data bits, comprising:

a multi-phase clock-generation component outputting n phases, wherein n is an integer greater than 1;

a selector comprising:

a delay block that outputs n phase selection bits, each phase selection bit respectively selecting or blocking each of said plurality of n phases; and a logical AND circuit that blocks or lets pass each of the plurality of phases according to the corresponding bit of the n phase selection bits;

a programmable amplitude selector for outputting a maximum pre-selected delay that controls jitter amplitude: and a logical OR circuit that combines the pre-selected delay with each blocked or passed phase of the selector and outputs the resultant delay as the generated predetermined delay.

18. A system for on-chip jitter injection into a high-speed test circuit, comprising:

a High Speed Input Output (HSIO) test circuit comprising:

a test signal generator operably coupled to a serializer for generating a parallel input test signal as input to the serializer, said serializer operably coupled to a transmit buffer of a transmitter to serialize the parallel input test signal to a serial test signal and input the serial test signal to the transmit buffer, a loop-back circuit arranged between the transmitter and a receiver for transmitting there-between the serial test signal, a deserializer for providing a parallel output test signal from the serial test signal received by the receiver and a Bit Error Rate (BER) counter to count errors in the parallel output test signal; and a variable delay inserted into the loop-back circuit to inject a predetermined amount of jitter into the serial test signal, wherein the variable delay is generated by a variable delay apparatus that generates a pre-determined delay corresponding to a desired jitter amplitude for an input sequence of data bits, comprising:

a multi-phase clock-generation component outputting n phases, wherein n is an integer greater than 1;

a selector comprising:

a delay block that outputs n phase selection bits, each phase selection bit respectively selecting or blocking each of said plurality of n phases; and a logical AND circuit that blocks or lets pass each of the plurality of phases according to the corresponding bit of the n phase selection bits;

a programmable amplitude selector for outputting a maximum pre-selected delay that controls jitter amplitude: and a logical OR circuit that combines the pre-selected delay with each blocked or passed phase of the selector and outputs the resultant delay as the generated predetermined delay.

19. The system of claim 18, wherein the loop-back circuit comprises a three input multiplexer to allow for selection of a straight loop-back.

* * * * *